(12) United States Patent
Takeuchi (10) Patent No.: US 7,186,920 B2
(45) Date of Patent: Mar. 6, 2007

(54) FLEXIBLE WIRING BOARD, AN INTERMEDIATE PRODUCT OF A FLEXIBLE WIRING BOARD, AND A MULTI-LAYER FLEXIBLE WIRING BOARD

(75) Inventor: Masanori Takeuchi, Kanuma (JP)

(73) Assignees: Sony Chemical & Information Device Corporation, Tokyo (JP); Sony Corporation, Tokyo (JP)

( * ) Notice: Subject to any disclaimer, the term of this patent is extended or adjusted under 35 U.S.C. 154(b) by 0 days.

(21) Appl. No.: 10/784,226

(22) Filed: Feb. 24, 2004

(65) Prior Publication Data

US 2004/0163844 A1 Aug. 26, 2004

Related U.S. Application Data

(62) Division of application No. 09/912,492, filed on Jul. 26, 2001, now Pat. No. 6,718,631.

(30) Foreign Application Priority Data

Jul. 27, 2000 (JP) .............................. 2000-226445

(51) Int. Cl.
*H05K 1/00* (2006.01)
*H05K 1/11* (2006.01)
*H01R 12/04* (2006.01)

(52) U.S. Cl. ...................... 174/254; 174/255; 174/262; 361/748; 361/792

(58) Field of Classification Search ................ 174/254, 174/250, 255, 262–266; 361/748–751, 792–795
See application file for complete search history.

(56) References Cited

U.S. PATENT DOCUMENTS

| | | | |
|---|---|---|---|
| 4,728,390 A | | 3/1988 | Yamamoto et al. |
| 4,816,323 A | * | 3/1989 | Inoue .......................... 428/210 |
| 4,830,691 A | | 5/1989 | Kida et al. |
| 5,723,822 A | * | 3/1998 | Lien ........................... 174/250 |
| 6,108,172 A | | 8/2000 | Hagen |
| 6,117,706 A | | 9/2000 | Yoshioka et al. |
| 6,184,479 B1 | * | 2/2001 | Okabe et al. ................ 174/262 |
| 6,453,553 B1 | | 9/2002 | Caillat et al. |
| 6,528,874 B1 | * | 3/2003 | Iijima et al. ................. 257/700 |
| 6,596,947 B1 | * | 7/2003 | Kurita et al. ................ 174/255 |
| 6,822,169 B2 | * | 11/2004 | Kataoka ..................... 174/254 |

* cited by examiner

*Primary Examiner*—Dean A. Reicharo
*Assistant Examiner*—Jeremy C. Norris
(74) *Attorney, Agent, or Firm*—Oliff & Berridge, PLC (57) ABSTRACT

The flexible wiring board has a first wiring film and a second wiring film. Because the first wiring film has a larger thickness than the second wiring film, the sectional area and electrical resistance of the first wiring film can be enlarged because of the larger film thickness even in a case where the first and second wiring films have almost the same width. Therefore, a high current can flow through the first wiring film, although the wiring film has a small width. As a result, a high density of the flexible wiring board can be easily achieved.

2 Claims, 7 Drawing Sheets

FLEXIBLE WIRING BOARD, AN INTERMEDIATE PRODUCT OF A FLEXIBLE WIRING BOARD, AND A MULTI-LAYER FLEXIBLE WIRING BOARD

This is a Division of application Ser. No. 09/912,492 filed Jul. 26, 2001 now U.S. Pat. No. 6,718,631. The entire disclosure of the prior application is hereby incorporated by reference herein in its entirety.

TECHNICAL FIELD TO WHICH THE INVENTION BELONGS

This invention belongs to the technical field of flexible wiring boards. More particularly, it relates to a technique of constructing flexible wiring boards having wiring films in which a high electric current appropriately flows.

PRIOR ART

There have been frequently employed flexible wiring boards having wiring films patterned in desired.

Figure 12:
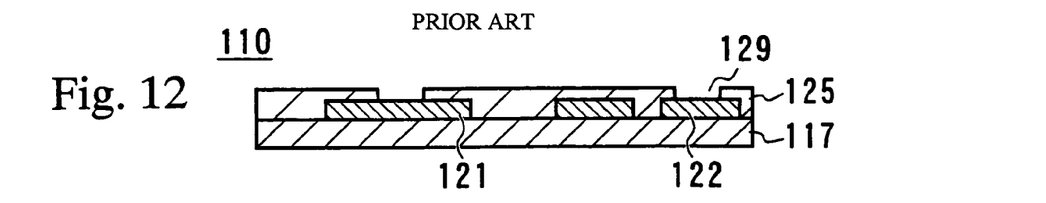
FIG. 12 is a diagram which shows a flexible wiring board of the conventional art.

In FIG. 12, the numerical symbol 110 stands for an example of flexible wiring boards of the conventional art.

This flexible wiring board 110 has a first resin film 117, first and second wiring films 121 and 122 located on the first resin film 117, and a second resin film 125 formed on the first and second wiring films 121 and 122.

Although the first and second wiring films 121 and 122 has the same thickness, the first wiring film 121 is wider than the second wiring film 122. Therefore, the sectional area of the first wiring film 121 is larger than the sectional area of the second wiring film 122.

Since the first wiring film 121 having the larger sectional area has a smaller electrical resistance than the second wiring film 122, a higher current can flows through it.

With the recent tendency toward high-density flexible wiring boards, it is required to be high density wiring film. However, such wide first wiring film 121 as described above interferes the density of wiring film.

The present invention, which has been made to solve the troubles encountering in the conventional art as described above, aims at providing a technique of constructing flexible wiring boards having wiring films which show a small electrical resistance and yet have been finely patterned.

SUMMARY OF THE INVENTION

To solve the above-described problems, the present invention provides a flexible wiring board having a first resin film, a first wiring film the bottom face of which is embedded into the first resin film, and a second wiring film the bottom face of which is adhered to the surface of the first resin film.

The present invention further provides a wiring board wherein the surfaces of the first wiring films is flush with second wiring.

The present invention further provide a flexible wiring board wherein a second resin film is formed on the surfaces of the first and second wiring films.

The present invention further provides a flexible wiring board wherein at least one first opening is formed in the part of the second resin film where the first wiring film is disposed.

The present invention further provides a flexible wiring board wherein at least one second opening is formed in the part of the second resin film where the second wiring film is disposed.

The present invention further provides a flexible wiring board wherein at least one third opening is formed in the part of the first resin film where the first wiring film is disposed.

The present invention further provides a flexible wiring board wherein a metal bump is located in at least one of the first openings.

The present invention further provides a flexible wiring board wherein a metal bump is located in at least one of the second openings.

The present invention further provides a flexible wiring board wherein a metal bump is located in at least one of the third openings.

The present invention further provides a process for producing a flexible wiring board which comprises the step of etching a metal foil halfway in the thickness direction to form concavities of a predetermined pattern on the surface of the metal foil, the step of forming a first resin film on the surface of the metal foil in the side where the concavities are formed, the step of forming a resist layer, which is provided with openings at the parts corresponding to the concavities, on the back face of the metal foil, and the step of etching the parts provided with the openings of the metal foil so as to divide the first wiring film having the same thickness as the thickness of the part of the metal foil where no concavity is formed and the second wiring film having the same thickness as the thickness of the part where the concavities are formed.

The present invention further provides a process for producing a flexible wiring board wherein a second resin film is formed on the first resin film in the side where the first and second wiring films are located.

The present invention further provides a process for producing a flexible wiring board wherein an opening is formed in the part of the first resin film where the first wiring film is located.

The present invention further provides a process for producing a flexible wiring board wherein openings are formed either in one or both of the part of the second resin film where the first wiring film is located and the part where the second wiring film is located.

The present invention has the constitution as described above. The flexible wiring board according to the present invention has the first and second wiring films separated from each other by a groove. The first wiring film is embedded into the first resin film and, therefore, has a thickness larger by the embedded depth than the film thickness of the second wiring film. Since the section area of the first wiring film is larger because of the larger film thickness, the electrical resistance of the first wiring film can be lowered even in case where the first wiring film has the same width as the second wiring film.

In the process for producing the flexible wiring board according to the present invention, concavities of a predetermined pattern are formed in a metal foil and then a resin solution is applied to the face having these concavities, thereby filling the concavities with the resin solution. Subsequently, the whole construct is dried and baked. Thus a first resin film having a flat surface can be formed.

When the above-described metal foil is patterned and a resin solution is applied to the surface of each wiring films thus formed, grooves located among these wiring films are filled with the resin solution. After drying and baking, a second resin film having a flat surface can be formed.

The surfaces of the first is flush with the second wiring film. When the above-described second resin film is formed on the first and second wiring films, the thickness of the second resin film on the first wiring film is almost the same as the thickness of the second resin film on the second wiring film. By forming openings in the second resin film by etching, therefore, the surfaces of the first and second wiring films can be exposed at the bottom faces of the openings almost at the same time as the etching proceeds.

MODE FOR CARRYING OUT THE INVENTION

Now, the invention will be illustrated by reference to the attached drawings.

FIGS. 1(a) to (e), FIGS. 2(f) to (j) and FIGS. 3(k) to (m) show a production process of the flexible wiring board of the first example according to the present invention.

Figure 1:
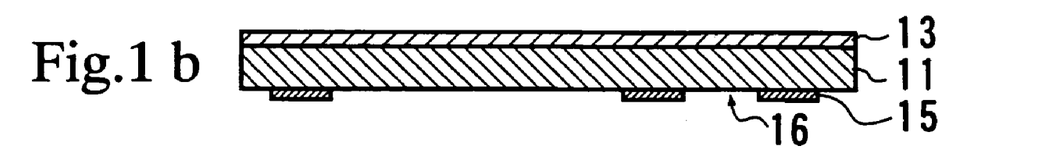
FIGS. 1(a) to (e) are diagrams which illustrate the early stage of a process for producing the flexible wiring board of the first example according to the present invention.
Figure 1A:
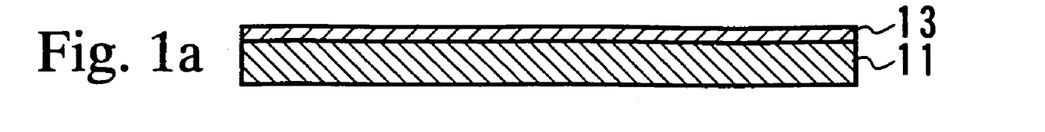

As FIG. 1(a) shows, a protective film 13 is applied to a metal foil 11 (a copper foil of 32 μm in thickness is used herein). After forming a resist layer on the back face of the metal foil 11, the resist layer is exposed, developed and pattered.

In FIG. 1(b), the numerical symbol 15 stands for the resist layer which has been patterned in the above step. A long and narrow opening 16 is formed in this resist layer 15 by the patterning and the metal foil 11 is exposed at the bottom face of this opening 16.

Figure 1C:
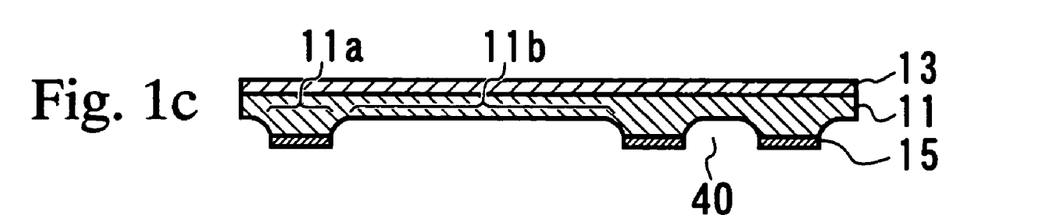

Next, the whole construct is immersed in a liquid etchant and thus the metal foil 11 exposed at the bottom face of the opening 16 is etched by 20 μm. Thus, a concavity 40 of 20 μm in depth, which has the same planar shape as the opening 16, is formed in the metal foil 11, as shown in FIG. 1(c).

As a result, a thick film part 11a protected with the resist layer 15 and a thin film part 11b, where the concavity 40 is located, are formed in the metal foil 11. The thick film part 11a has the same thickness as the original thickness of the metal foil 11. On the other hand, the thin film part 11b has a thickness reduced by the depth of the concavity 40, compared with the thickness of the thick film part 11a. In this case, the thin film part 11b has a thickness of 12 μm.

Figure 1D:
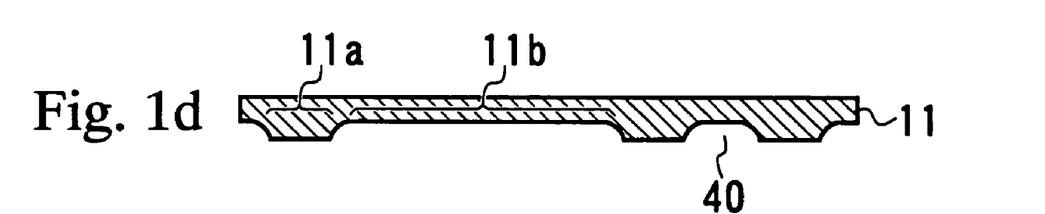
Figure 1E:
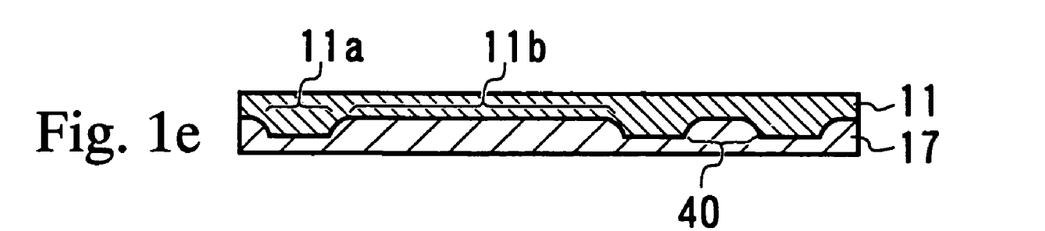

Next, the resist layer 15 on the surface of the metal foil 11 and the protective film 13 on the back face of the metal foil 11 are peeled off (FIG. 1(d)) and a polyimide resin solution is applied to the surface of the metal foil 11 wherein the concavity 40 is formed until the thin film part 11b and the thick film part 11a are submerged. Thus the concavity 40 in the metal foil 11 is filled with this resin solution. Then the construct is dried as such and baked. As a result, a first resin film 17 made of a polyimide film with a flat surface is formed as shown in FIG. 1(e).

Figure 2F:
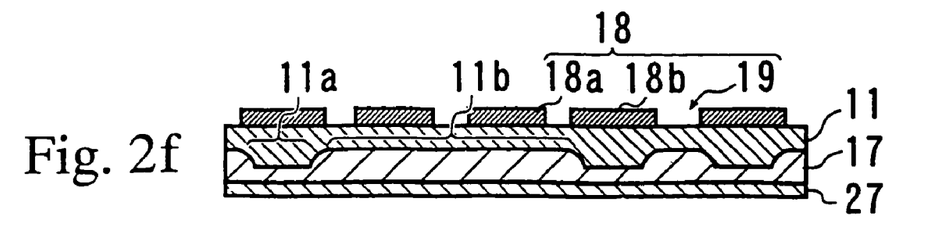
FIGS. 2(f) to (j) are diagrams which illustrate the intermediate stage of a process for producing the flexible wiring board of the first example according to the present invention.

Next, a protective film 27 is applied to the flat surface of the first resin film 17 and a resist layer is formed on the face in the opposite side of the metal foil 11 to the side where the first resin film 17 has been formed. Subsequently, the resist layer is patterned by exposing and developing to thereby form a resist layer 18 having plural openings 19 on the thin film part 11b of the metal foil 11, as shown in FIG. 2(f). The thin film part 11b of the metal foil 11 is exposed at the bottom faces of the openings 19.

These openings have a long and narrow shape and the resist layer 18 is divided into plural parts by these openings 19. The numerical symbol 18b stands for the resist layer located on the surface of the thick film part 11a of the metal foil 11, while the numerical symbol 18a stands for the resist layer located on the surface of the thin film part 11b of the metal foil 11.

Next, the whole construct is immersed in a liquid etchant and thus the metal foil 11 is etched in the parts located at the bottom faces of the openings 19. After etching the metal foil 11 by the thickness of the thin film part 11b, the resist layer 18 is peeled off.

Figure 2G:
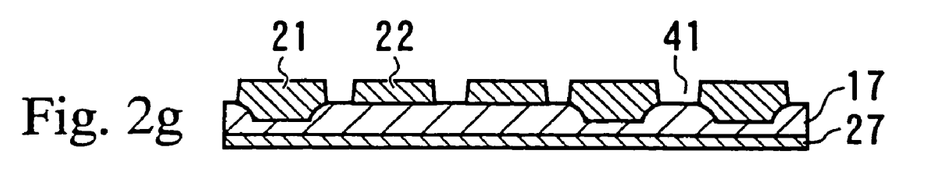
Figure 2H:
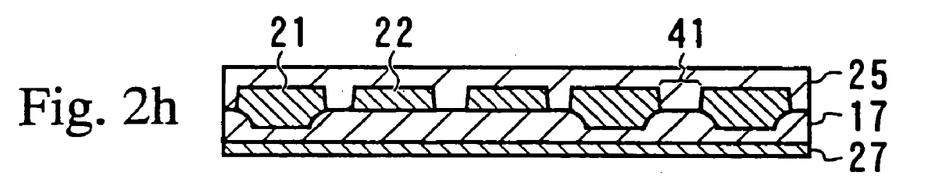

FIG. 2(g) shows the state thus achieved. In this figure, the numerical symbol 41 stands for a groove formed in the metal foil 11 by etching. The groove 41 has the same planar shape as the opening 19 of the resist layer 18. The first resin film 17 is exposed at the bottom face of the groove 41 and the metal foil 11 is divided into plural parts by these grooves 41.

In FIG. 2(g), the numerical symbol 21 stands for the first wiring film consisting of the part of the metal foil 11 where the thick film part 11a is located, while the numerical symbol 22 stands for the second wiring film consisting of the part of the metal foil 11 where the thin film part 11b is located.

In this state, the bottom faces of the first wiring film 21 and the second wiring film 22 are fixed to the first resin film 17. The bottom face of the second wiring film 22 is located on the surface of the first resin film 17, while the bottom face of the first wiring film 21 is located more deeply than the bottom face of the second wiring film 22 and embedded into the first resin film 17. The surface of the first wiring film 21 is located at the same height as the surface of the second wiring film 22 and thus the surfaces of first wiring film 21 is flush with the surface of the second wiring film 22. Therefore, the first wiring film 21 has a thickness larger than the second 22 by the depth embedded into the first resin film 17.

Next, a polyimide resin solution is applied to the surface of the first resin film 17 in the side where the first and second wiring films 21, 22 is formed until the first and second wiring films 21 and 22 are submerged. Thus the groove dividing the first and second wiring films 21 and 22 is filled with the resin soluiton. Then the whole construct is dried and baked. As a result, a second resin film 25 made of a polyimide film having a flat surface is formed (FIG. 2(h)).

Figure 2I:
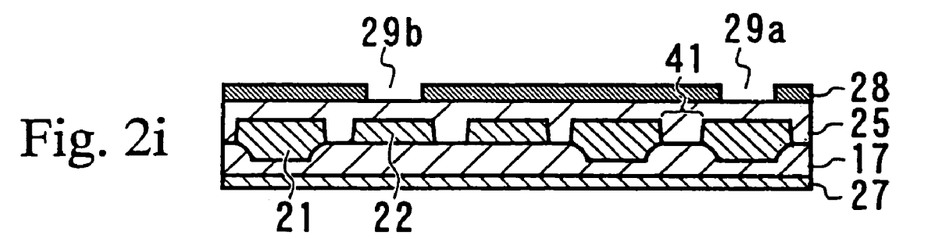

Next, a resist layer patterned in a predetermined shape is formed on the surface of the second resin film 25. In FIG. 2(i), the numerical symbol 28 stands for a resist layer 28 formed on the surface of the second resin film 25. In this resist layer 28, circular openings are formed at predetermined positions by patterning. In FIG. 2(i), the numerical symbol 29a stands for a circular opening formed in the part where the first wiring film 21 is located, while the numerical symbol 29b stands for a circular opening formed in the part where the second wiring film 22 is located. The second resin film 25 is exposed at the bottom faces of these circular openings 29a and 29b.

Subsequently, an alkali solution is sprayed onto the surface of the resist layer 28 so as to etch the second resin film 25 exposed at the bottom faces of the circular openings 29a and 29b in the resist layer 28.

The thickness of the second resin film 25 on the first wiring film 21 is almost the same as the thickness of the second resin film 25 on the second wiring film 22. Therefore, the surfaces of the first and second wiring films are exposed almost at the same time as the etching proceeds.

Figure 2J:
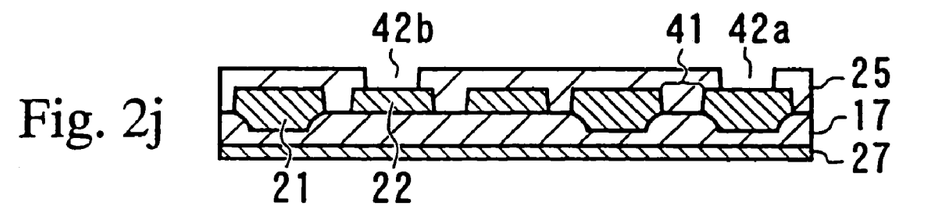

Next, the resist layer 28 is removed. As a result, first and second openings 42a and 42b, which have been patterned so as to give the same diameter as the circular openings 29a and 29b, are formed in the second resin film 25 located upper side of the first wiring film 21 and the second wiring film 22, as FIG. 2(j) shows.

After peeling off the protective film 27 from the surface of the first resin film 17, a resist layer 37 having circular openings 39 at predetermined positions of the first resin film 17 located below the first wiring film 21 is formed. Then a new protective film 30 is applied to the surface of the second resin film 25 (FIG. 3(k)).

Figure 3K:
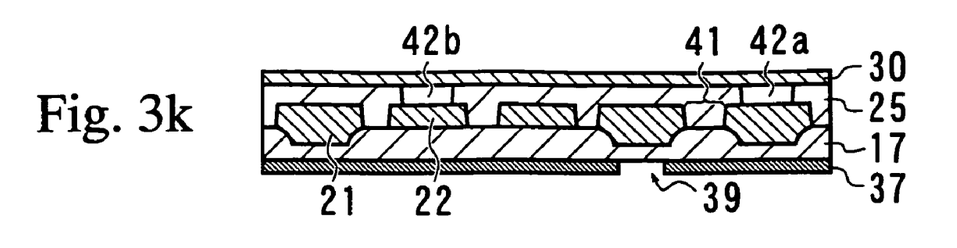
FIGS. 3(k) to (m) are diagrams which illustrate the latter stage of a process for producing the flexible wiring board of the first example according to the present invention.

Subsequently, an alkali solution is sprayed onto the surface of the resist layer 37 so as to etch the first resin film 17 exposed at the bottom face of the circular opening 39.

Figure 3L:
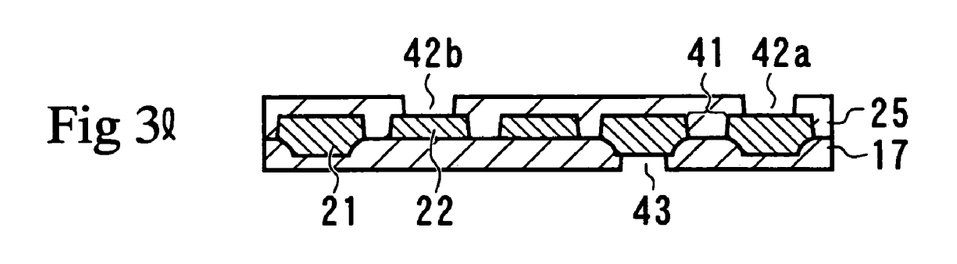

Next, the protective film 30 and the resist layer 37 are peeled off. As a result, a third opening 43, which has been patterned so as to give the same diameter as the circular opening 39, is formed in the first resin film located upper side of the first wiring film 21 as shown in FIG. 3(l).

Next, the whole construct is immersed in an electrolytic plating solution and electric current flows therethrough. Thus, a thin metal film grows at the bottom faces of the first, second and third openings 42a, 42b and 43 to form a metal coating 45.

Figure 3M:
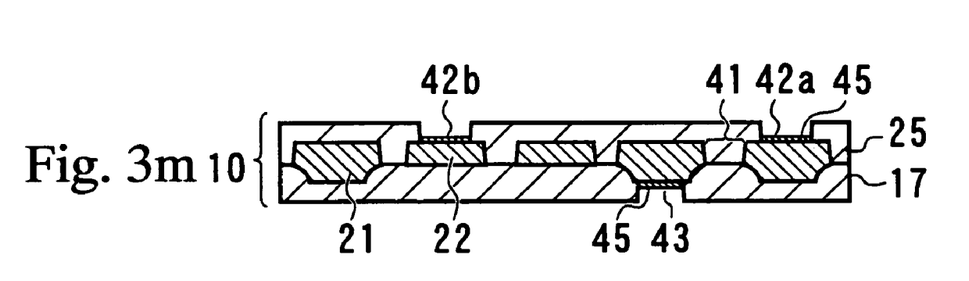

In FIG. 3(m), the numerical symbol 10 stands for the flexible wiring board according to the present invention in the state after the formation of the metal coating 45.

In this flexible wiring board 10, the width of the first wiring film 21 is almost the same as the width of the second wiring film 22. However, the thickness of the first wiring film 21 is larger than the thickness of the second wiring film 22 and thus the first wiring film 21 has a larger sectional area because of the larger film thickness.

Next, a process for producing a multi-layer flexible wiring board by laminating the flexible wiring board 10 constructed by the above process on other flexible wiring boards will be illustrated by reference to FIGS. 4(a) to (c) and 5(d).

Figure 4:
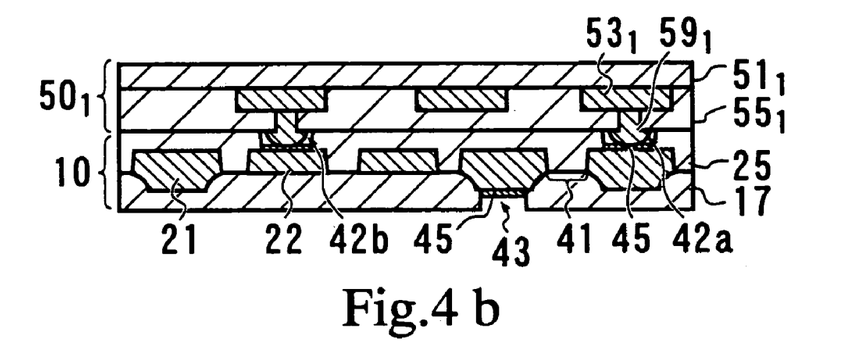
FIGS. 4(a) to (c) are diagrams which illustrate the early stage of a process for producing a multi-layer flexible wiring board by using the flexible wiring board according to the present invention.
Figure 4A:
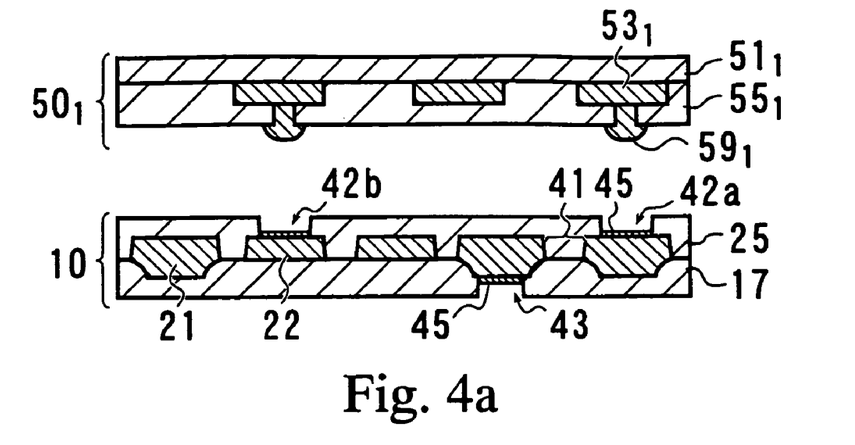
Figure 4C:
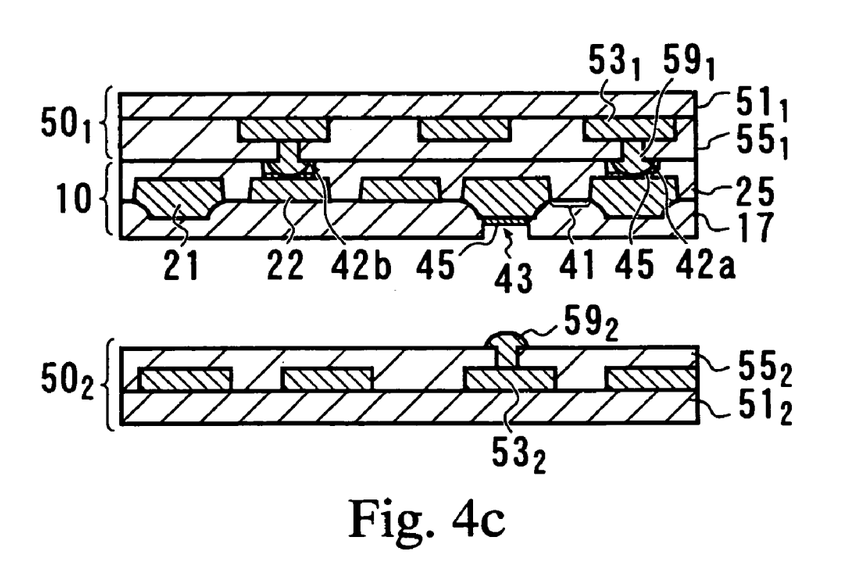

The numerical symbol $50_1$ in FIG. 4(a) and the numerical symbol $50_2$ in FIG. 4(c) stand for monolayer flexible wiring boards to be used in laminating on the flexible wiring board according to the present invention. Members common to these flexible wiring boards $50_1$ and $50_2$ are discriminate from each other by attached characters 1 and 2 respectively.

These flexible wiring boards $50_1$ and $50_2$ respectively have base films $51_1$ and $51_2$, plural copper wires $53_1$ and $53_2$ located on these base films $51_1$ and $51_2$, and cover films $55_1$ and $55_2$ formed on the copper wires $53_1$ and $53_2$. The cover films $55_1$ and $55_2$ include a thermoplastic resin as the main component.

On the surfaces of the copper wires $53_1$ and $53_2$, metal bumps $59_1$ and $59_2$ are formed upright and the heads of these metal bumps $59_1$ and $59_2$ protrude respectively on the surfaces of the cover films $55_1$ and $55_2$.

To construct a multi-layer flexible wiring board by laminating the above-described flexible wiring boards $50_1$ and $50_2$ on the flexible wiring board 10 according to the present invention, the metal bumps $59_1$ of one of the monolayer flexible wiring board $50_1$ are located toward the first and second openings 42a and 42b in the second resin film 25 of the flexible wiring board 10 according to the present invention, as shown in FIG. 4(a).

Next, these metal bumps $59_1$ are brought into contact with the metal coating 45 exposed at the bottom faces of the first and second openings 42a and 42b. Thus, the second resin film 25 of the flexible wiring board 10 and the cover film $55_1$ of the flexible wiring board $50_1$ are closely contact with each other.

When the whole construct is pressed in this state under heating, the thermoplastic resin in the cover film $55_1$ exerts its adhesiveness due to the heating. When the whole construct is further heated, a solder plating layer (not shown) formed on the surface of the metal bumps $59_1$ is molten.

Subsequently, the whole construct is cooled. Then the molten solder plating layer solidifies. Thus, metal bumps $59_1$ and the first and second wiring films 21 and 22 are connected to each other via the solder plating layer which has solidified. At the same time, the flexible wiring boards 10 and $50_1$ are mechanically laminated via the cover film $55_1$.

Next, the metal bumps $59_2$ of the other monolayer flexible wiring board $50_2$ are located toward the third openings 43 of the first resin film 17 of the flexible wiring board 10 according to the present invention.

Next, these metal bumps $59_2$ are brought into contact with the metal coating 45 exposed at the bottom face of the third openings 43 as shown in FIG. 4(c). Thus, the first resin film 17 is closely contact with the cover film $55_2$. When the whole construct is pressed in this state under heating and then cooled, the metal bumps $59_2$ are connected to the first wiring film 21 via a solder plating layer (not shown) and, at the same time, the flexible wiring boards 10 and $50_2$ are laminated via the cover film $55_2$.

Figure 5D:
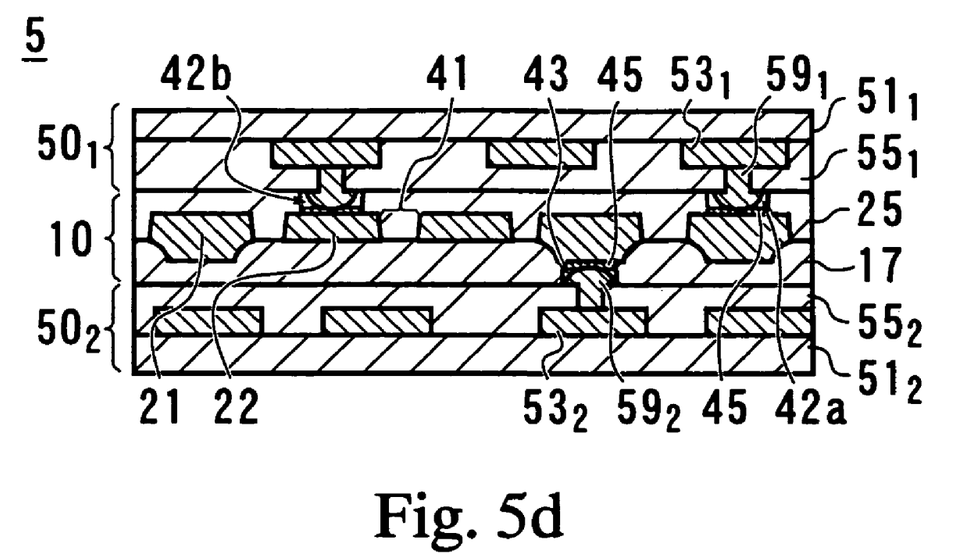
FIG. 5(d) is a diagram which illustrates the latter stage of a process for producing a multi-layer flexible wiring board by using the flexible wiring board according to the present invention.

The numerical symbol 5 in FIG. 5(d) shows a multi-layer flexible wiring board constructed by laminating monolayer flexible wiring boards $50_1$ and $50_2$ on respective faces of the flexible wiring board 10 according to the present invention.

In this flexible wiring board 5, the copper wires $53_1$ and $53_2$ are connected to the first and second wiring films 21 and 22 via the metal bumps $59_1$ and $59_2$.

Figure 6:
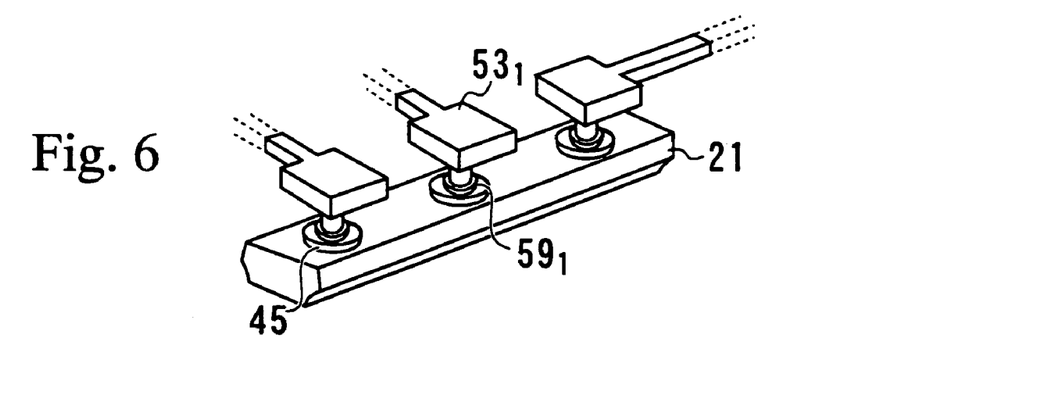
FIG. 6 is a diagram which shows the relative location of the first wiring film of the flexible wiring board of the present invention and the copper wires of another flexible wiring board.

FIG. 6 is a diagram showing the relative location of the first wiring film 21 and copper wires $53_1$ of another flexible wiring board $50_1$. In this diagram, three copper wires $53_1$ are shown. Each copper wire $53_1$ has a wide part, on the surface of which a metal bump $59_1$ is provided, and a narrow part.

Each metal bump $59_1$ is connected to the metal coating 45 on the first wiring film 21 via a plating layer (not shown). Namely, the first wiring film 21 is electrically connected to plural copper wires $53_1$.

Because of having a larger thickness than each copper wire $53_1$, the first wiring film 21 has a larger sectional area. Owing to the larger sectional area, the electrical resistance of the first wiring film 21 is smaller than the electrical resistance of each copper wire $53_1$. In case where an electrical current flows from plural copper wires $53_1$ into the first wiring film 21, the first wiring film 21 can allow the passage of the current with a small voltage drop.

Although illustration has been made on a case where the metal coating 45 is exposed at the bottom faces of the first to third openings 42a, 42b and 43 of the flexible wiring board 10, the present invention is not restricted thereto.

Figure 7:
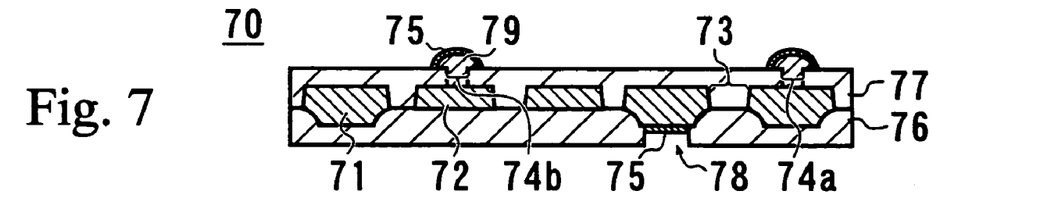
FIG. 7 is a diagram which illustrates the flexible wiring board of the second example according to the present invention.
Figure 8:
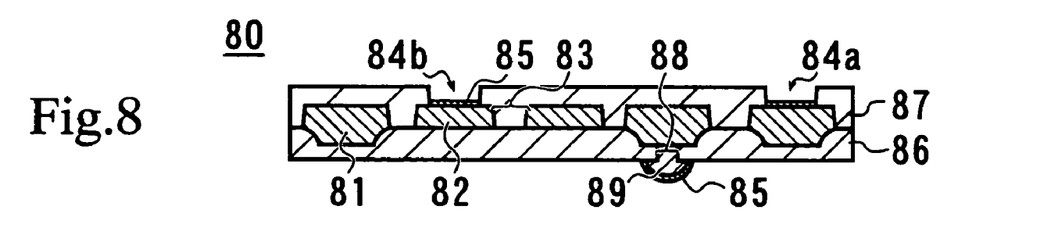
FIG. 8 is a diagram which illustrates the flexible wiring board of the third example according to the present invention.
Figure 9:
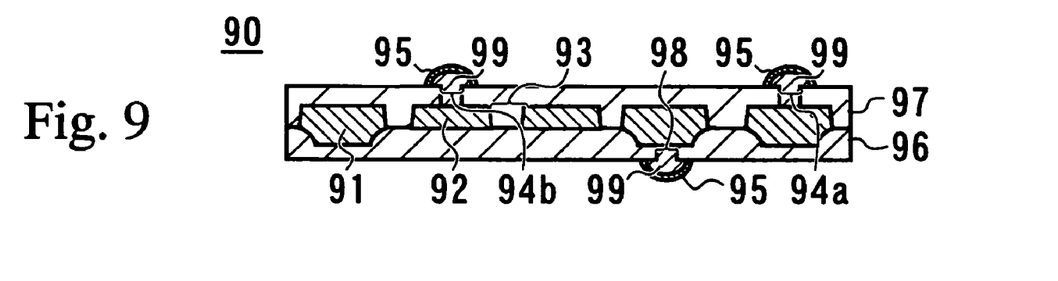
FIG. 9 is a diagram which illustrates the flexible wiring board of the fourth example according to the present invention.

The numerical symbols 70 in FIG. 7, 80 in FIG. 8 and 90 in FIG. 9 respectively show flexible wiring boards of the second to fourth examples according to the present invention.

Similar to the flexible wiring board 10 as shown in FIG. 3(m), these flexible wiring boards 70, 80 and 90 respectively have first resin films 76, 86 and 96, first and second wiring films 71, 72, 81, 82, 91 and 92 formed on the first resin films 76, 86 and 96, and second resin films 77, 87 and 97 formed on the surface of the first and second wiring films 71, 72, 81, 82, 91 and 92. The first wiring films 71, 81 and 91 are separated from the second wiring films 72, 82 and 92 by grooves 73, 83 and 93.

Third openings 78, 88 and 98 are formed in the first resin films 76, 86 and 96, while first and second openings 74a, 74b, 84a, 84b, 94a and 94b are formed in the second resin films 77, 87 and 97.

In the flexible wiring board 70 of the second example as shown in FIG. 7, among these flexible wiring boards 70, 80 and 90, a metal coating 75 formed at the bottom surface of the first wiring film 71 is exposed at the bottom face of the third opening 78, while metal bumps 79 are provided in the first and second openings 74a and 74b. These metal bumps 79 are formed upright respectively on the surface of first and second wiring films 71 and 72. The head of each metal bum 79 protrudes on the surface of the second resin film 77.

In the flexible wiring board 80 of the third example as shown in FIG. 8, a metal coating 85 formed at the surfaces of the first and second wiring films 81 and 82 is exposed at the bottom faces of the first and second openings 84a and 84b, while metal bumps 89 are provided in the third opening 88. These metal bumps 89 are formed upright on the bottom surface of the first wiring film 71. The head of each metal bump 89 protrudes on the surface of the first resin film 86, similar to the case of the flexible wiring board 70 of the second example.

In the flexible wiring board 90 of the fourth example as shown in FIG. 9, metal bumps 99, which are formed upright on the surfaces of the first and second wiring films 91 and 92, are provided in the first and second openings 94a and 94b. The head of each metal bump 99 protrudes on the surface of the second resin film 97. In the third opening 98, a metal bump 99, which is formed upright on the bottom face of the first wiring film 91, is provided and the head of the metal bump 99 protrudes on the surface of the first resin film 96.

Metal coatings 75, 85 and 95 are formed respectively on the heads of the metal bumps 79, 89 and 99 of these flexible wiring boards 70, 80 and 90 of the second to fourth examples.

Although illustration has been made on a case where the flexible wiring board according to the present invention is connected to other flexible wiring boards 50 to construct the multi-layer flexible wiring board 5, the present invention is not restricted thereto.

Figure 10:
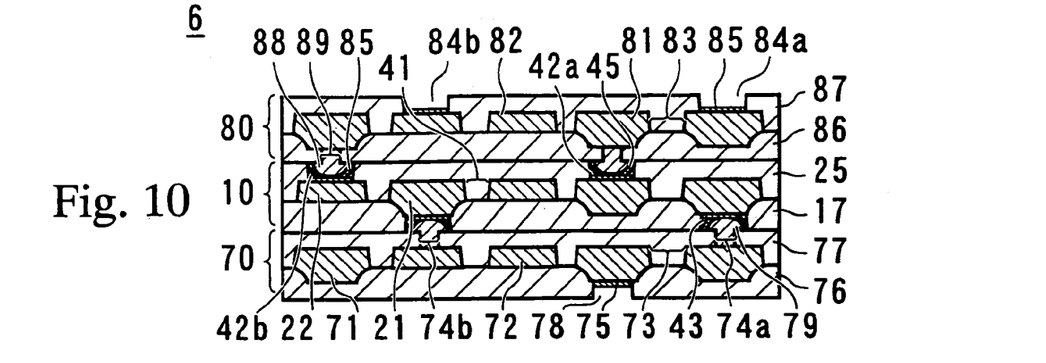
FIG. 10 is a diagram which illustrates another example of the flexible wiring board according to the present invention.

The numerical symbol 6 in FIG. 10 stands for a multi-layer flexible wiring board constructed by connecting the flexible wiring boards according to the present invention represented by 70 in FIG. 7 and 80 in FIG. 8 to the flexible wiring board 10 according to the present invention represented by 10 in FIG. 3(m). Namely, it is also possible to obtain the multi-layer flexible wiring board 6 by using the flexible wiring boards 10, 70 and 80 of the present invention.

Use may be made of a resin film containing a thermoplastic resin as at least one of the first and second resin films of the flexible wiring board according to the present invention. In this case, it is unnecessary to use a thermoplastic resin in the resin films of the other flexible wiring board to be laminated.

Moreover, a case where none of the resin films used in the flexible wiring boards to be laminated has thermoplasticity also falls within the scope of the present invention.

The numerical symbol 50 in FIG. 11 stands for a flexible wiring board which has the same structure as the flexible wiring boards represented by $50_1$ and $50_2$ in FIG. 4 but the resin constituting the cover film 55 has no thermoplasticity.

Figure 11A:
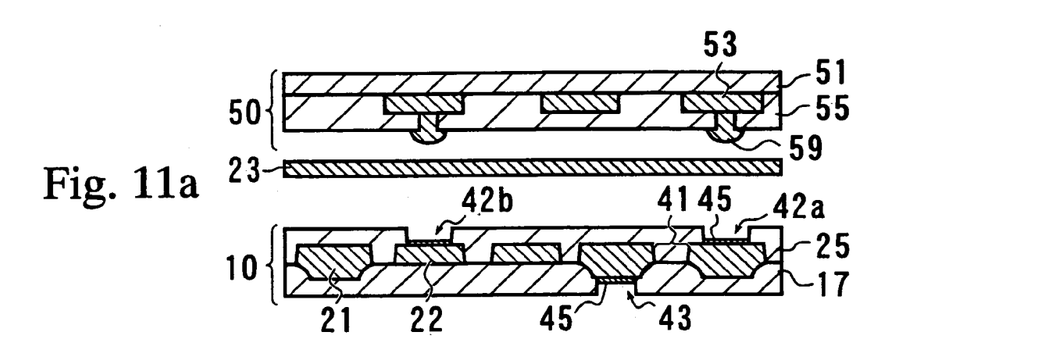
FIGS. 11(a) and (b) are diagrams which illustrate another process for connecting the flexible wiring board according to the present invention to another flexible wiring board.
Figure 11B:
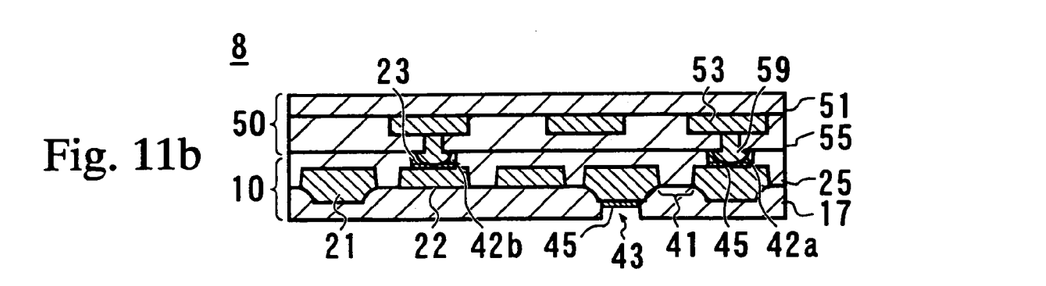

To connect this flexible wiring board 50 to the flexible wiring board 10 according to the present invention, a thermoplastic resin film 23 (i.e., an adhesive film) is put between the flexible wiring boards 10 and 50, and then positioning is performed so that the metal bumps 59 are located toward the first and second openings 42a and 42b (FIG. 11(a)).

Next, the resin film 23 is inserted between the flexible wiring boards 10 and 50. Thus, the heads of the metal bumps 59 are brought into contact with the resin film 23. Then the whole construct is pressed under heating in this state. As a result, the resin film is softened by heating and the metal bumps 59 push aside the softened resin film 23 due to the pressure. Thus the heads of the metal bumps 59 are brought into contact with the metal coating 45 at the bottom faces of the first and second openings 42a and 42b, thereby electrically connecting the flexible wiring boards 10 and 50 to each other.

In this process, the resin film exhibits adhesiveness under heating. Thus, the flexible wiring boards 10 and 50 are mechanically connected to each other too so as to give a multi-layer flexible wiring board 8 (FIG. 11(b)). It is also possible to use a so-called anisotropic conductive film, wherein conductive particles are dispersed in a resin film, as a substitute for the resin film 23.

Although illustration has been made on a case where solder metal layers are formed on the heads of the metal bumps 59 of the monolayer flexible wiring boards $50_1$ and $50_2$ to be used in laminating to the flexible wiring board 10 according to the present invention, the present invention is not restricted thereto.

For example, a flexible wiring board having no solder plating layer on the heads of the metal bumps can be laminated to the flexible wiring board 10 according to the present invention by, after mechanically connecting to the flexible wiring board 10 by the steps of FIGS. 4(a) and (b), applying ultrasonic wave so as to connect the metal bumps to the wiring films.

The present invention makes it possible to construct wiring films having a small width and yet showing a small electrical resistance. In flexible wiring boards provided with such wiring films, a high density can be easily achieved.

What is claimed is:

1. A multi-layer flexible wiring board comprising a first flexible wiring board and a second flexible wiring board connecting each other, wherein
the first flexible wiring board having:
a first resin film;
a first wiring film, a bottom face of which is embedded into the first resin film;
a second wiring film, a bottom face of which is in contact with a surface of the first resin film;
a second resin film formed on a surface of the first wiring film and a surface of the second wiring film, and
at least one first opening is formed in a part of the second resin film where the first wiring film is disposed,
at least one second opening is formed in a part of the second resin film where the second wiring film is disposed,
the second flexible wiring board comprises a base film, and a wire on the base film,
wherein a face of the second flexible wiring board at a side where the wire is disposed is located toward a face of the first flexible wiring board at a side where the second resin film is disposed,
a first bump is arranged in the first opening,
the wire of the second flexible wiring board is connected to the first wiring film by the first bump,
a second bump is arranged in the second opening,
the wire of the second flexible wiring board is connected to the second wiring film by the second bump.

2. A multi-layer flexible wiring board as claimed in claim 1, further comprising:
a third flexible wiring board having a base film, and a wire on the base film,
wherein a face of the third flexible wiring board at a side where the wire is disposed is located toward a face of the first flexible wiring board at a side where the first resin film is disposed,
at least one third opening is formed in a part of the first resin film where the first wiring film is disposed,
a third bump is arranged in the third opening,
the wire of the third flexible wiring board is connected to the first wiring film by the third bump.

* * * * *